United States Patent
Kim et al.

(10) Patent No.: US 6,552,942 B2
(45) Date of Patent: Apr. 22, 2003

(54) DATA LINE PRECHARGING CIRCUIT OF A SEMICONDUCTOR MEMORY DEVICE

(75) Inventors: Hyung-Gon Kim, Seoul (KR); Seok-Cheon Kwon, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/878,071

(22) Filed: Jun. 6, 2001

(65) Prior Publication Data

US 2002/0054527 A1 May 9, 2002

(30) Foreign Application Priority Data

Nov. 9, 2000 (KR) .................................... 2000-066543

(51) Int. Cl.$^7$ ................................................ G11C 7/00
(52) U.S. Cl. ........................................ 365/203; 365/233
(58) Field of Search ................................. 365/203, 233, 365/189.12, 189.04, 189.01, 207, 189.11

(56) References Cited

U.S. PATENT DOCUMENTS

| | | | | | |
|---|---|---|---|---|---|
| 5,671,181 | A | * | 9/1997 | Hatsuda | 365/189.05 |
| 6,023,436 | A | * | 2/2000 | Han | 365/203 |
| 6,198,679 | B1 | * | 3/2001 | Nakasu et al. | 365/203 |

* cited by examiner

*Primary Examiner*—Michael S. Lebentritt
*Assistant Examiner*—Anh Phung
(74) *Attorney, Agent, or Firm*—Marger Johnson & McCollom P.C.

(57) ABSTRACT

A semiconductor memory device has at least one data line, registers for storing data bits, and switch elements corresponding to the registers for transferring the data bits to the data line in response to corresponding selection signals. It also has a precharge circuit connected to the data line, for precharging the data line to a power supply voltage in response to a precharge control signal. The selection signals are sequentially activated at a predetermined time interval by synchronously responding to a clock signal, and the precharge control signal is activated during the interval of the selection signals, by synchronously responding to the clock signal.

7 Claims, 3 Drawing Sheets

DATA LINE PRECHARGING CIRCUIT OF A SEMICONDUCTOR MEMORY DEVICE

This application relies for priority upon Korean Patent Application No. 2000-066543, filed on Nov. 9, 2000, the contents of which are herein incorporated by reference in their entirety.

FIELD OF THE INVENTION

The present invention generally relates to semiconductor memory devices and, more specifically, to a semiconductor memory device capable of read out normally data with a low power supply voltage.

BACKGROUND OF THE INVENTION

FIG. 1 is a block diagram showing a data output construction in semiconductor memory device according to the conventional art.

Referring to FIG. 1, a plurality of registers R0~Rn correspond to a single data line DL, and respectively store data bits read from a data storage region or a memory cell array. The registers R0~Rn are connected to the data line DL through corresponding selection transistors M0~Mn which are respectively controlled by corresponding selection signals SEL0~SELn. Here, the selection signals SEL0~SELn are sequentially activated in accordance with decoded results of address.

An inverter I11 is connected to the data line DL. Inverter I11 serves as a driver for transferring the data of the data line DL to an output terminal.

In a circuit operation, it is assumed that one, e.g., SEL1, of the selection signals SEL0~SELn is selected. Selections is by controlling the voltages. The selected signal SEL1 has power supply voltage Vdd, while the other signals SEL0 and SEL2~SELn have ground voltage. Thus, the N-channel metal oxide semiconductor (NMOS) transistor M1 is turned on, while the NMOS transistors M0, and M2~Mn are turned off. Accordingly, a data bit held in the register R1 is transferred to the data line DL through the turned-on NMOS transistor M1.

Transfer is as follows: If the data bit held in the register R1 is "0", the inverter I11 provides data bit DOUT of "1" by responding to a discharged potential of the data line DL. If the stored data bit in the register R1 is "1", the potential of the data line DL is Vdd–Vth. Vth is a threshold voltage of the NMOS transistor. The difference is because the power supply voltage corresponding to the data bit "1" is dropped by an amount equaling the threshold voltage Vth of the NMOS transistor M1.

A problem in the prior art arises at high speeds. In the circuit of FIG. 1, when the next decoding output is activated fast, it will be before the prior output has become inactive. This means that the activation periods of two successive selection signals overlap.

As a result of overlapping, output terminals of the registers corresponding to the signals become connected to each other, resulting in losing the data bits stored in the registers. And then, if the stored data bit is "1", the potential of the data line DL becomes Vdd–Vth, for the reason described above. In the case that the potential of the data line DL is lower than a trigger voltage of the inverter I11 by the lowered power supply voltage Vdd, the data cannot read out normally.

SUMMARY OF THE INVENTION

It is, therefore, an object of the present invention to provide a semiconductor memory device capable of normally reading out data even at a low power supply voltage level.

It is another object of the present invention to provide a semiconductor memory device capable of preventing data register selection signals from overlapping.

In order to attain the above objects, according to an aspect of the present invention, there is provided a semiconductor memory device having at least one data line, a plurality of registers for storing data bits, a plurality of switch elements for transferring the stored data bits to the data line. The device includes a precharge circuit connected to the data line, for precharging the data line to a power supply voltage.

According to the semiconductor memory device of the present invention, the data can be read out even in low power supply voltage by precharging the data line to the power supply voltage.

Additional features and advantages of the invention will be understood from the following description and drawings, in which:

BRIEF DESCRIPTION OF THE DRAWINGS

The above and other objects, features and advantages of the present invention will become more apparent from the following detailed description, when taken in conjunction with the accompanying drawings, in which like reference symbols indicate the same or similar components, wherein.

DESCRIPTION OF THE PREFERRED EMBODIMENT

In the following description for purposes of explanation, specific numbers, materials and configurations are set forth in order to provide a thorough understanding of the present invention. However, it should be understood that the description of the preferred embodiments is merely illustrative and that it should not be taken in a limiting sense. In other instances, well-known systems are shown in diagrammatic or block diagram form in order not to obscure the present invention.

Figure 1:
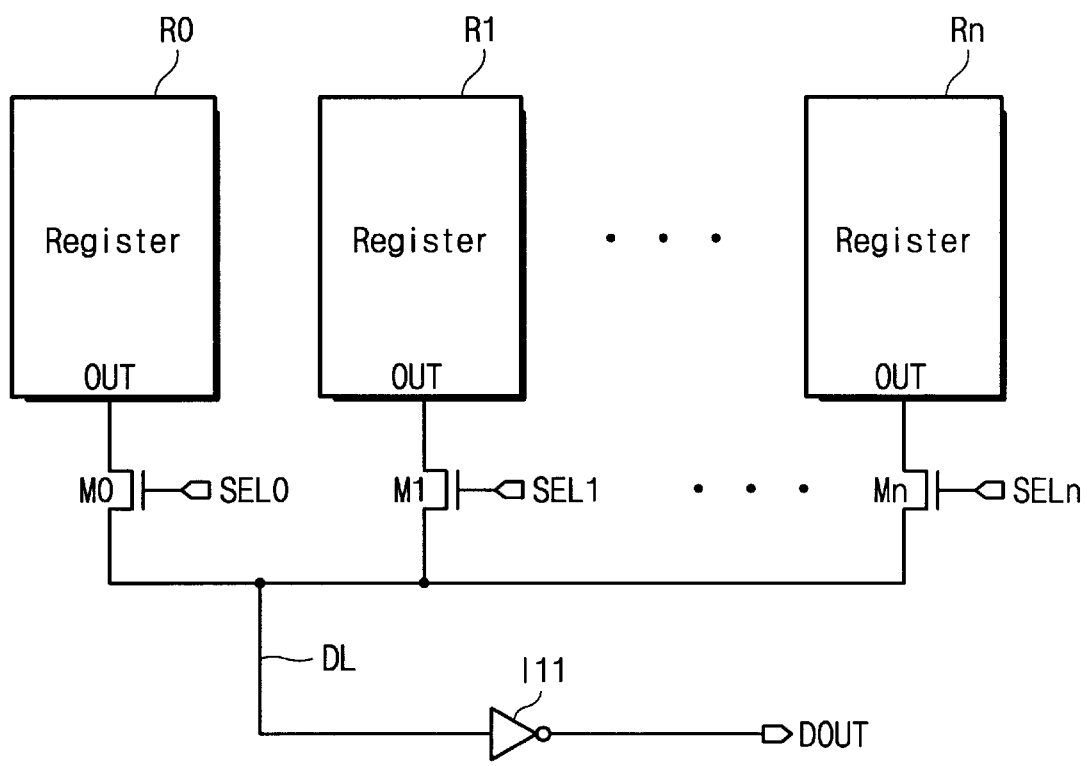
FIG. 1 is a circuit diagram of a data output construction in a semiconductor memory device according to the prior art.
Figure 2:
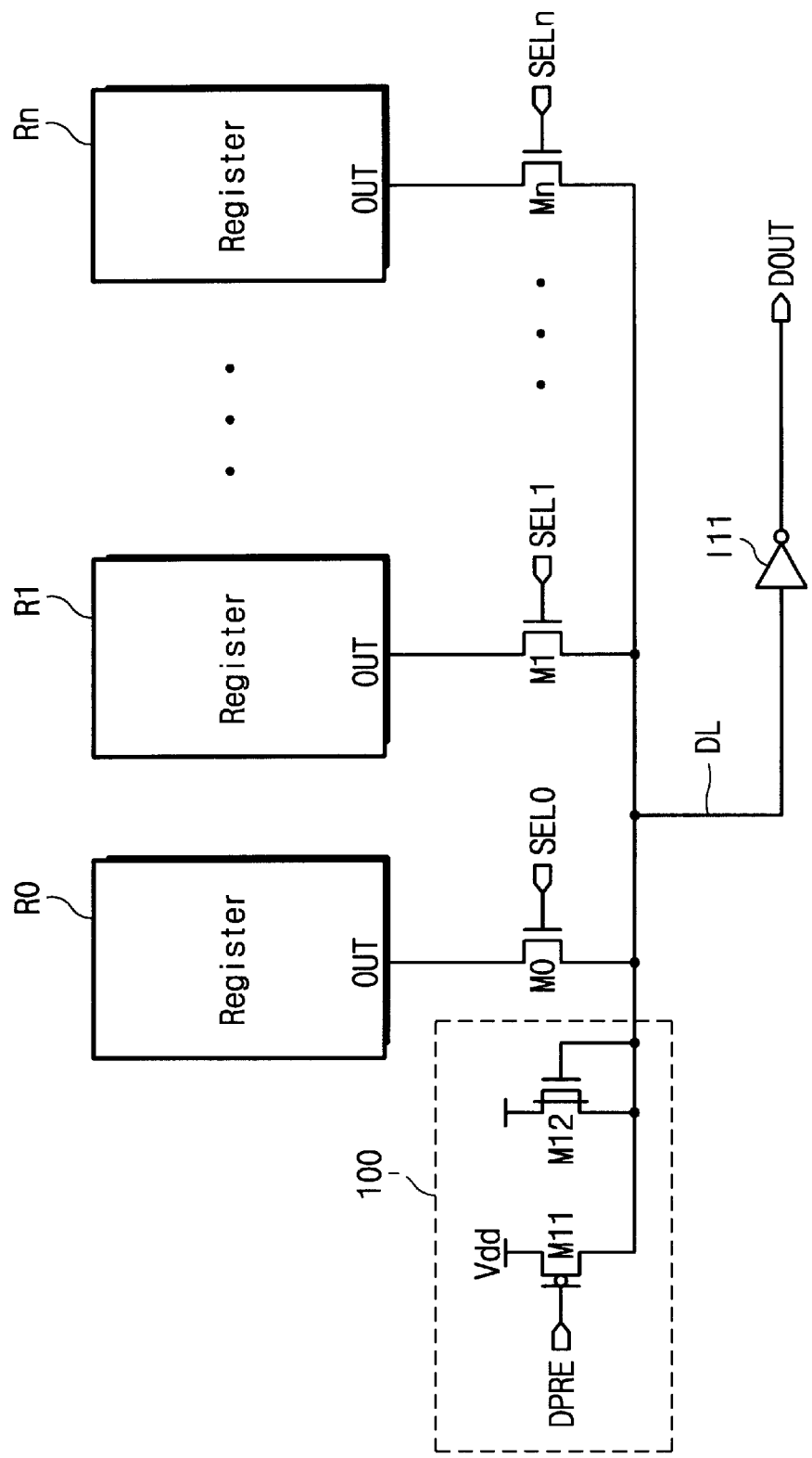
FIG. 2 is a circuit diagram of a data output construction in a semiconductor memory device according to a preferred embodiment of the present invention.
Figure 3:
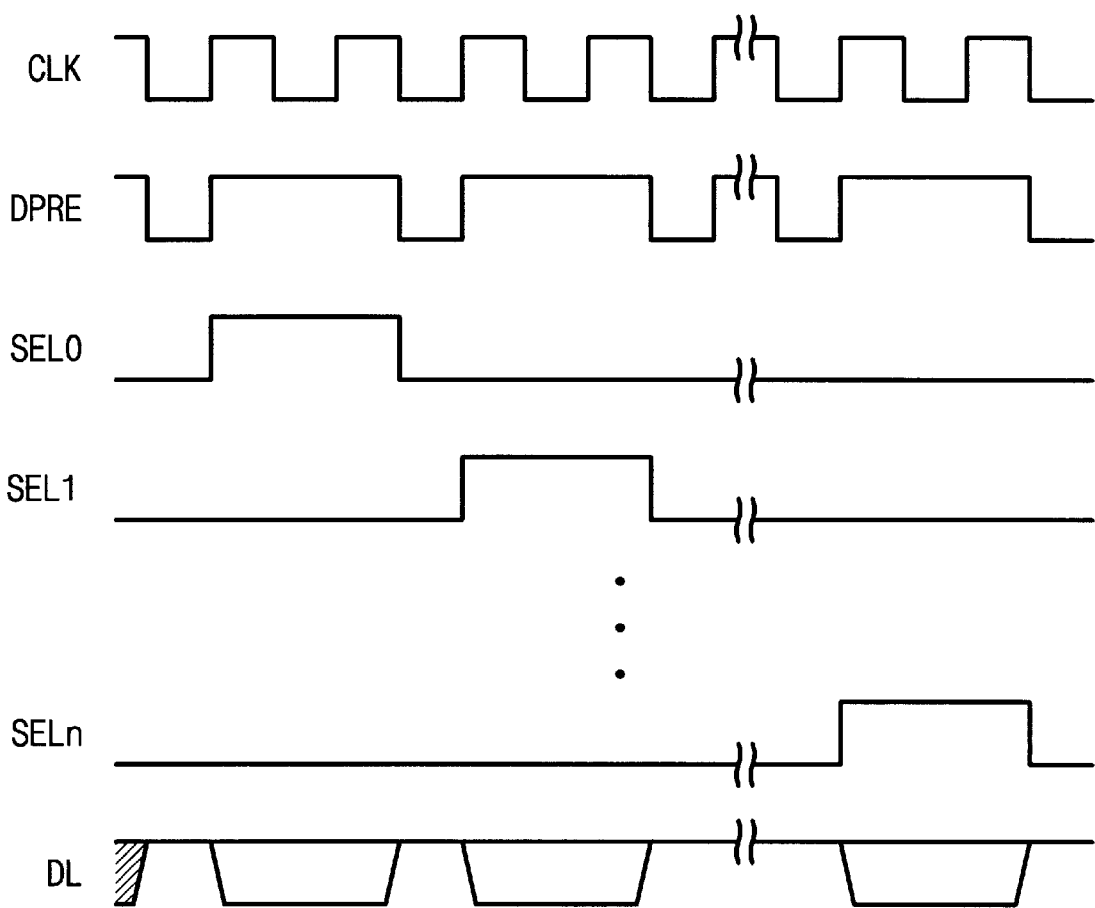
FIG. 3 is a timing diagram showing a timing of control signals that are used in the construction of FIG. 2.

FIG. 2 is a circuit diagram showing a data output construction in a semiconductor memory device according to a preferred embodiment of the present invention, and FIG. 3 is a timing diagram showing a timing of control signals that are used in the construction of FIG. 2.

Referring to FIG. 2 shows an arrangement associated with a data storage region of the device. A data line precharge circuit 100 is connected to data line DL. Circuit 100 is formed of P-channel MOS (PMOS) transistor M11 and depletion MOS (DMOS) transistor M12. The PMOS transistor M11 has a current path connected between power supply voltage Vdd and the data line DL, and a gate coupled to precharge control signal DPRE. The DMOS transistor M12 has a current path connected between the power supply voltage and the data line DL, and a gate coupled to the data line DL. The precharge control signal DPRE is enabled or disabled by synchronously responding to clock signal CLK, as shown in FIG. 3.

Registers R0~Rn which store data. NMOS transistors M0~Mn are for selectively connecting the registers R0~Rn to the data line DL. Connection is individually turning them on, in response to corresponding selection signals SEL0~SELn.

The selection signals SEL0~SELn are selected by the decoding address. The selection signals SEL0~SELn are enabled or disabled by synchronously responding to the clock signal CLK, as shown in FIG. 3. There is a predetermined time interval between enabling a selection signal (e.g., SEL1) after disabling the previous one (e.g., SEL0). The predetermined time interval may be an interval corresponding to half-period of the clock signal.

The selection signals SEL0~SELn of the invention do not overlap. In fact, during the time interval between activation of the selection signals SEL0 and SEL1, the precharge control signal DPRE is enabled by synchronously responding to the clock signal CLK.

In a circuit operation, when the selection signals SEL0~SELn are maintained at a low voltage (low state), the PMOS transistor M11 is turned on by the low-leveled precharge control signal DPRE. This permits the data line DL to be precharged to the power supply voltage Vdd through the PMOS transistor M11.

When the clock signal CLK makes a low to high transition, the selection signal SEL0 is enabled synchronously, while simultaneously the precharge control signal DPRE is disabled. Since the selection signal SEL0 is enabled, the data stored in the register R0 is transferred to the data line DL through the turned-on NMOS transistor M0.

The stored data is transferred as follows. In the case that the data bit stored in the register R0 is "1", there is no charge transfer through NMOS transistor M0, because the voltages on its source and drain are equal to Vdd, the power supply voltage. Therefore, the data line DL retains its precharged state.

An advantage of the invention is that, even if operating at a low operation voltage (or, low power supply voltage Vdd), the data bit "1" is normally provided. This happens because there is no voltage drop caused by the NMOS transistor which serves as a selection transistor.

Meanwhile, if the data bit stored in the register R0 is "0", the charges which are precharged in the data line DL go out to the register R0 through the NMOS transistor M0. Thus, the data bit "0" is read out normally.

In this embodiment, the data line precharge circuit 100 is applicable to all semiconductor memory devices. It may find advantageous use in flash memory devices, and particularly to a NAND-type flash memory device. In that case, the clock signal CLK serves as a read enable signal/RE utilized in the NAND-type flash memory device, and the registers R0~Rn serve as page buffers. It will become apparent to those skilled in the art that any signals may be used which change periodically. For example, the clock signal CLK may be used.

As the foregoing descriptions, the present invention provides a memory cell array capable of preventing the data loss stored in the registers, by activating the selection signals applied to the selection transistors which selectively connect the registers to the data line, at a predetermined time interval. Further, even in the low power supply voltage, the data is normally provided by precharging the data line to the power supply voltage.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A semiconductor memory device comprising:
   at least one data line;
   a plurality of registers for storing data bits; a plurality of switch elements corresponding to the registers for transferring the data bits of the corresponding registers to the data line in response to corresponding selection signals; and
   a precharge circuit connected to the data line for precharging the data line to a power supply voltage in response to a precharge control signal, the precharge circuit including a depletion MOS transistor, wherein
      the selection signals are sequentially activated at a predetermined time interval by synchronously responding to a clock signal, and
      the precharge control signal is activated during the interval of the selection signals by synchronously responding to the clock signal.

2. The device of claim 1, wherein the depletion MOS transistor has a current path connected between the power supply voltage and the data line, and a gate coupled with the data line.

3. The device of claim 1, wherein the precharge circuit includes:
   a P-channel metal oxide semiconductor (PMOS) transistor having a current path connected between the power supply voltage and the data line, and
   a gate coupled with the precharge control signal.

4. The device of claim 3, wherein the depletion MOS transistor has a current path connected between the power supply voltage and the data line, and a gate coupled with the data line.

5. The device of claim 1, wherein the precharge circuit comprises:
   a PMOS transistor coupled between a first reference voltage and the data line and having a gate driven by the precharge control signal; and
   the depletion mode transistor coupled between the first reference voltage and the data line, the gate of the depletion mode transistor also coupled to the data line.

6. A semiconductor memory device comprising:
   at least one data line;
   a plurality of registers for storing data bits;
   a plurality of switch elements corresponding to the registers for transferring the data bits of the corresponding registers to the data line in response to corresponding selection signals; and
   a precharge circuit connected to the data line for precharging the data line to a power supply voltage in response to a precharge control signal, said precharge circuit including a depletion MOS transistor having a current path connected between the power supply voltage and the data line, and a gate coupled with the data line, wherein
      the selection signals are sequentially activated at a predetermined time interval by synchronously responding to a clock signal, and
      the precharge control signal is activated during the interval of the selection signals by synchronously responding to the clock signal.

7. A semiconductor memory device comprising:
   at least one data line;
   a plurality of registers for storing data bits;
   a plurality of switch elements corresponding to the registers for transferring the data bits of the corresponding registers to the data line in response to corresponding selection signals; and a precharge circuit connected to the data line for precharging the data line to a power supply voltage in response to a precharge control signal, said precharge circuit including a P-channel metal oxide semiconductor (PMOS) transistor having a current path connected between the power supply voltage and the data line, a gate coupled with the precharge control signal, and a depletion MOS transistor having a current path connected between the power supply voltage and the data line, and a gate coupled with the data line, wherein the selection signals are sequentially activated at a predetermined time interval by synchronously responding to a clock signal, and the precharge control signal is activated during the interval of the selection signals by synchronously responding to the clock signal.

* * * * *